United States Patent
Suzuki et al.

(10) Patent No.: US 10,418,262 B2
(45) Date of Patent: Sep. 17, 2019

(54) GAS FLOATED WORKPIECE SUPPORTING APPARATUS AND NONCONTACT WORKPIECE SUPPORT METHOD

(71) Applicant: THE JAPAN STEEL WORKS, LTD., Shinagawa-ku, Tokyo (JP)

(72) Inventors: Yuki Suzuki, Kanagawa (JP); Sadao Tanigawa, Kanagawa (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 0 days.

(21) Appl. No.: 16/185,902

(22) Filed: Nov. 9, 2018

(65) Prior Publication Data

US 2019/0088507 A1    Mar. 21, 2019

Related U.S. Application Data

(63) Continuation of application No. 15/553,990, filed as application No. PCT/JP2016/054088 on Feb. 12, 2016, now Pat. No. 10,147,625.

(30) Foreign Application Priority Data

Feb. 27, 2015 (JP) .................................. 2015-039050

(51) Int. Cl.
*H01L 21/677*  (2006.01)
*F16C 32/06*   (2006.01)
(Continued)

(52) U.S. Cl.
CPC .......... *H01L 21/677* (2013.01); *B65G 49/065* (2013.01); *F16C 32/0614* (2013.01);
(Continued)

(58) Field of Classification Search
CPC ..... H01L 21/683; H01L 21/677–67736; F16C 2380/18; F16C 32/0622; F16C 32/0625;
(Continued)

(56) References Cited

U.S. PATENT DOCUMENTS

| | | | |
|---|---|---|---|
| 2007/0160454 A1 * | 7/2007 | Iida ...................... | B65G 49/065 414/806 |
| 2012/0225206 A1 | 9/2012 | Yudovsky | |
| 2016/0240419 A1 | 8/2016 | Sieber et al. | |

FOREIGN PATENT DOCUMENTS

| | | | | |
|---|---|---|---|---|
| CN | 101284602 A | 10/2008 | | |
| DE | 102011082427 A1 * | 3/2012 | ............ | B23K 26/16 |
| JP | 04102347 A | 4/1992 | | |
| JP | 09082784 A | 3/1997 | | |
| JP | 2004325217 A | 11/2004 | | |
| JP | 2006266351 A | 10/2006 | | |

(Continued)

OTHER PUBLICATIONS

Translation of JP 2007-51001.*
Translation of DE 102011082427.*

(Continued)

*Primary Examiner* — Selim U Ahmed
*Assistant Examiner* — Evan G Clinton
(74) *Attorney, Agent, or Firm* — Holtz, Holtz & Volek PC

(57) ABSTRACT

An apparatus for conveying a substrate includes a base along which the substrate is conveyed, a first upward gas ejecting section, a second upward gas ejecting section and a third upward gas ejecting section disposed over the base, the third upward gas ejecting section being disposed between the first and second upward gas ejecting sections, and a first downward gas ejecting section and a second downward gas ejecting section disposed above and facing respective portions of the third upward gas ejecting section. Gas ejected upward from the first, second and third upward gas ejecting sections floats the substrate. The substrate is subjected to pressure by gas ejected downward from the first and second downward gas ejecting sections. The first and second downward gas ejecting sections are spaced to provide a working area therebetween and through which the substrate is irradiated with a laser beam.

13 Claims, 8 Drawing Sheets

(51) Int. Cl.
  *H01L 21/683*  (2006.01)
  *B65G 49/06*  (2006.01)
  *H01L 27/146*  (2006.01)

(52) U.S. Cl.
  CPC ...... *F16C 32/0618* (2013.01); *F16C 32/0622* (2013.01); *F16C 32/0625* (2013.01); *H01L 21/683* (2013.01); *H01L 27/146* (2013.01); *B65G 2249/04* (2013.01); *F16C 2326/58* (2013.01); *F16C 2380/18* (2013.01)

(58) Field of Classification Search
  CPC . F16C 32/0614; F16C 32/0618; B65G 49/065
  See application file for complete search history.

(56) References Cited

FOREIGN PATENT DOCUMENTS

| | | |
|---|---|---|
| JP | 2007051001 A | 3/2007 |
| JP | 2008076170 A | 4/2008 |
| JP | 2008110852 A | 5/2008 |
| JP | 2008310249 A | 12/2008 |

OTHER PUBLICATIONS

English translation of the International Preliminary Report on Patentability (IPRP) dated Sep. 8, 2017 issued in counterpart International Application No. PCT/JP2016/054088.
International Search Report (ISR) and Written Opinion dated May 10, 2016 issued in International Application No. PCT/JP2016/054088.

* cited by examiner

GAS FLOATED WORKPIECE SUPPORTING APPARATUS AND NONCONTACT WORKPIECE SUPPORT METHOD

CROSS REFERENCE TO RELATED APPLICATIONS

This application is a Continuation application of U.S. patent application Ser. No. 15/553,990, filed Aug. 26, 2017, which is a U.S. National Phase application of International Patent Application No. PCT/JP2016/054088, filed Feb. 12, 2016, which is based on and claims priority to Japanese Patent Application No. JP 2015-039050, filed Feb. 27, 2015. The entire contents of all the above-identified applications are incorporated herein by reference.

TECHNICAL FIELD

The present invention relates to a gas floated workpiece supporting apparatus and a noncontact workpiece support method that float a plate-shaped workpiece such as a glass substrate by ejection of gas in a noncontact manner.

BACKGROUND ART

Several proposals have been made for apparatuses that float plate-shaped workpieces of a glass substrate and the like by gas ejection so far.

For example, Patent Literature 1 proposes a floatation suction mixture section 50 that is provided with a porous block 51 generating a positive pressure and a suction block 52 generating a negative pressure respectively on a base, as illustrated in FIG. 7, (A). In the porous block 51, air is supplied, and the air is ejected from a top surface of a porous body to hold a plate-shaped workpiece 100 formed of a glass substrate in a noncontact state. At the same time, a suction force is worked in the suction block 52 to draw the glass substrate 100 to a top surface side of the floatation suction mixture section 50. By harmony of the suction force and the aforementioned floating force, the glass substrate 100 floats with a substantially fixed floating amount with respect to the top surface of the floatation suction mixture section 50, and a stable floating state is obtained.

Further, as illustrated in FIG. 8, (A), in Patent Literature 2, the plate-shaped workpiece 100 floated above a flotation device 60 is chucked and conveyed in arrow directions with a conveying device not illustrated. In the flotation device 60, air is ejected from entire surfaces of porous plates 61, and the entire surfaces of the porous plates 61 become air bearing surfaces, so that it becomes possible to float the plate-shaped workpiece 100 without causing a warp, and convey the plate-shaped workpiece 100 without contacting the porous plates 61. Further, in a suction hole 62, a force that sucks the plate-shaped workpiece 100 is generated. The suction force regulates a floatation amount of the plate-shaped workpiece 100 that is floated by the air ejected from the porous plate 61. Accordingly, by controlling the suction force, it becomes possible to control the floatation amount of the plate-shaped workpiece 100.

CITATION LIST

Patent Literature

[Patent Literature 1] Japanese Patent Laid-Open No. 2006-266351
[Patent Literature 2] Japanese Patent Laid-Open No. 2008-110852

SUMMARY OF INVENTION

Technical Problem

However, in the apparatus shown in Patent Literature 1, the area that generates a positive pressure and the area that generates a negative pressure are in different blocks, so that the floating force is generated in the positive pressure area, and the suction force is generated in the negative pressure area individually. Consequently, when the floating amounts of the substrate over the positive pressure generating block and the negative pressure generating block are compared, a certain difference in floating amount occurs, and when seen as the entire glass substrate as illustrated in FIG. 7, (B), flatness is low in reality. Consequently, when flatness of the entire surface of the substrate or a part of the substrate needs to be high in the process of performing processing to the entire surface of the substrate or the part of the substrate, the apparatus has the problem of being unable to satisfy the condition.

Further, in the apparatus illustrated in Patent Literature 2, devices are made so that the difference does not arise in floating amount on the positive pressure generating area (porous plate) and the negative pressure generating area (suction hole) in terms of the internal structure, but in reality, at the time of a large glass substrate floating across a plurality of flotation devices, it is difficult for air to escape in a central portion of the glass substrate as illustrated in FIG. 8, (B), depending on how the flotation devices are arranged. This generates the phenomenon in which an air pool is generated by the positive pressure that is generated from the porous plate, the substrate central portion is raised, and flatness of the entire glass substrate becomes low. In order to eliminate the phenomenon, there are cited the method of disposing many suction holes in the central portion of the glass substrate, but it becomes the problem that the central portion is not fixed because the glass is conveyed and the optimum layout of the suction holes changes depending on the glass size.

The present invention is made to solve the problems of the conventional apparatuses as described above, and one of the objects of the present invention is to provide a gas floated workpiece supporting apparatus and a noncontact workpiece support method that unify a floating amount of an entire surface of a plate-shaped workpiece of a glass substrate or the like, and can increase flatness of the plate-shaped workpiece.

Solution to Problem

To be more specific, a gas floated workpiece supporting apparatus of one aspect of the present invention includes a gas upward ejector ejecting gas upward, and a gas downward ejector located at an upper side from the gas upward ejector and ejecting gas downward, wherein the gas downward ejector is installed at a position where the gas downward ejector ejects the gas downward from above a plate-shaped workpiece and applies pressure, to the plate-shaped workpiece that is floated and supported by the gas ejected from the gas upward ejector.

According to the above-described present invention, the plate-shaped workpiece is sandwiched by gas ejection from above, and gas ejection from below, the plate-shaped workpiece can be stably supported in a noncontact manner, and flatness of the plate-shaped workpiece can be enhanced.

The gas floated workpiece supporting apparatus of another aspect of the present invention is the aforementioned invention, wherein a part or a whole of the gas downward ejector is installed to correspond to a whole or a part of a region where the gas upward ejector is installed.

According to the above-described present invention, the gas downward ejector can be disposed in accordance with the gas upward ejector, or the gas upward ejector can be disposed in accordance with the gas downward ejector, the plate-shaped workpiece can be favorably sandwiched by the gas in a desired area, and flatness of the plate-shaped workpiece can be increased.

The gas floated workpiece supporting apparatus of another aspect of the present invention is the aforementioned present invention, wherein the gas downward ejector is installed except for a working area for the plate-shaped workpiece.

According to the present invention, by disposing the gas downward ejector in an area except for the working area, the predetermined work can be smoothly performed.

Further, by the working method (process) of the plate-shaped workpiece, the floating amount and floating rigidity of the workpiece can be adjusted.

The gas floated workpiece supporting apparatus of another aspect of the present invention is the aforementioned present invention, wherein the gas downward ejector is installed in accordance with part of a region where the gas upward ejector is installed, with a working area for the plate-shaped workpiece sandwiched between the gas downward ejector and the gas upward ejector.

According to the above-described present invention, by sandwiching the plate-shaped workpiece located in the working area by gas from both sides, the flatness of the plate-shaped workpiece in the working area is increased, and precise work is enabled.

In the process of performing work to a part of the plate-shaped workpiece, not only the entire surface but also the vicinity of a working point is included as the structure of the present invention, whereby the structure that obtains a uniform floating amount can be made with respect to a part of the plate-shaped workpiece. The floating amount and the floating rigidity at this time can be arbitrarily set by adjusting the flow rate and pressure of the pressurized gas from the gas downward ejector, and the flow rate and the pressure of the pressurized gas from the gas upward ejector. Further, pressure is applied to the plate-shaped workpiece from upward and downward directions, so that the force that corrects the plate-shaped workpiece to be flat is generated especially in the vicinity of the working area.

The gas floated workpiece supporting apparatus of another aspect of the present invention is the aforementioned present invention, and further includes a position adjusting section that adjusts blowout positions partially or entirely with respect to one or both of a plurality of gas upward ejection holes provided in the gas upward ejector and a plurality of gas downward ejection holes provided in the gas downward ejector.

According to the above-described present invention, it becomes possible to adjust pressure applied to the plate-shaped workpiece and change the floating position by adjustment of the blowout position by the position adjusting section.

The gas floated workpiece supporting apparatus of another aspect of the present invention is the aforementioned present invention, wherein the position adjusting section is capable of position adjustment individually for each of ejection holes positions of which are adjustable, or every predetermined number of ejection holes.

According to the above-described present invention, by adjustment to some of the ejection holes, a warp and a curve of the plate-shaped workpiece can be precisely corrected.

The gas floated workpiece supporting apparatus of another aspect of the present invention is the aforementioned present invention, and further includes a gas flow adjusting section that adjusts a gas blowout flow rate and/or pressure, with respect to a plurality of gas upward ejection holes provided in the gas upward ejector, and a part or all of a plurality of gas downward ejection holes provided in the gas downward ejector.

According to the above-described present invention, it is possible to adjust the pressure which is applied to the plate-shaped workpiece and change the floating position by adjustment of the blowout flow rate and or pressure by the gas flow adjusting section.

The gas floated workpiece supporting apparatus of another aspect of the present invention is the aforementioned present invention, wherein the gas flow adjusting section is capable of adjusting a gas blowout flow rate and/or pressure individually for each of ejection holes gas flows of which are adjustable, or every predetermined number of ejection holes.

According to the above-described present invention, a warp and a curve of the plate-shaped workpiece can be precisely corrected by adjustment to some of the ejection holes.

The gas floated workpiece supporting apparatus of another aspect of the present invention is the aforementioned present invention, and further includes a control section that controls an adjustment amount of the position adjusting section at a time of floating and supporting the plate-shaped workpiece.

According to the above-described present invention, adjustment of the position adjusting section can be performed dynamically by operation of the control section.

The gas floated workpiece supporting apparatus of another aspect of the present invention is the aforementioned present invention, and further includes a control section that controls an adjustment amount of the gas flow adjusting section at a time of floating and supporting the plate-shaped workpiece.

According to the above-described present invention, adjustment of the gas flow adjusting section can be performed dynamically by operation of the control section.

The gas floated workpiece supporting apparatus of another aspect of the present invention is the aforementioned present invention, and further includes a detection section that detects a height position of the plate-shaped workpiece, wherein the control section controls the adjustment amount based on a detection result of the detection section.

According to the above-described present invention, stable support and high flatness can be obtained by controlling the position adjusting section and the gas flow adjusting section, in accordance with the state of the plate-shaped workpiece.

The gas floated workpiece supporting apparatus of another aspect of the present invention is the aforementioned present invention, wherein some or all of a plurality of downward ejection holes provided in the gas downward ejector are overlaid on a plurality of upward ejection holes provided in the gas upward ejector, in mutual blowout directions.

According to the above-described present invention, the positions of the downward ejection holes are overlaid on the positions of the information ejection holes in the blowout directions, whereby the plate-shaped workpiece can be favorably sandwiched with upper and lower pressures.

A noncontact workpiece support method of one aspect of the present invention is such that gas is ejected to the plate-shaped workpiece from above and below a plate-shaped workpiece respectively, and the plate-shaped workpiece is floated and supported in a noncontact manner while the plate-shaped workpiece is sandwiched by the gas.

The noncontact workpiece support method of another aspect of the present invention is the aforementioned present invention, wherein a warp and a curve of the plate-shaped workpiece are corrected to flatten the plate-shaped workpiece, by adjusting one or both of a gap amount of ejection positions of gas to the plate-shaped workpiece, and a flow rate of the gas.

Advantageous Effects of Invention

More specifically, according to the present invention, the plate-shaped workpiece is floated by ejecting gas to an arbitrary surface (the entire or a part of the surface) of the plate-shaped workpiece from the upward and downward directions, so that uniform forces are applied to the arbitrary surface of the plate-shaped workpiece, an equivalent floating amount is obtained on the entire arbitrary surface of the plate-shaped workpiece, and further there is provided the effect of correcting a warp and a curve of the arbitrary surface of the plate-shaped workpiece to flatten the surface, by the forces.

BRIEF DESCRIPTION OF DRAWINGS

The above and other objects, advantages and features of the present invention will become more fully understood from the detailed description given herein below and the appended drawings which are given by way of illustration only, and thus are not intended as a definition of the limits of the present invention, and wherein.

DESCRIPTION OF EMBODIMENTS

Embodiment 1

Figure 1:
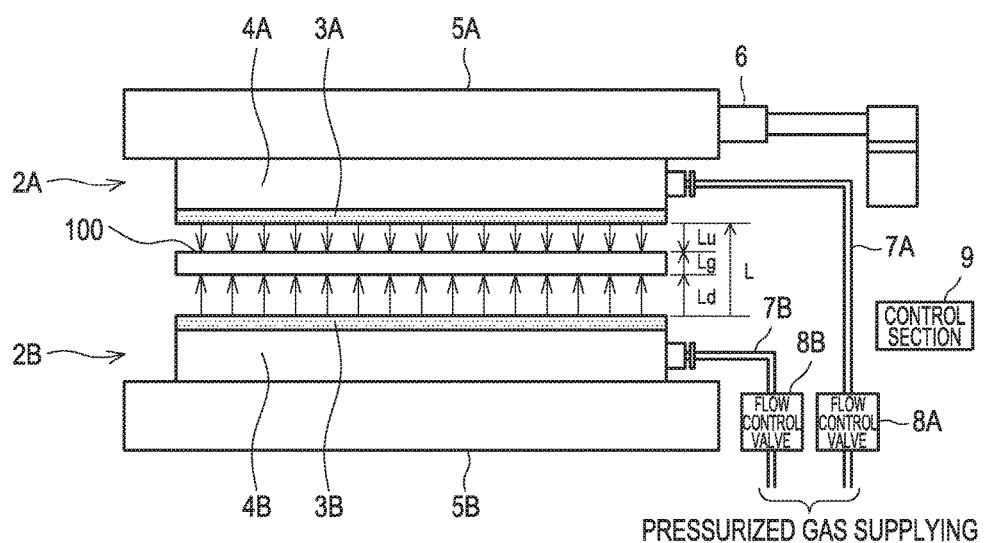
FIG. 1 is a diagram illustrating a gas floated workpiece supporting apparatus of one embodiment of the present invention.

Hereunder, one embodiment of the present invention will be described based on the accompanying drawings.

In a gas floated workpiece supporting apparatus 1, a stage 2A configured to float a workpiece at an upper portion side, and a stage 2B configured to float a workpiece at a lower portion side are installed face-to-face with a space left vertically.

The stage 2A has a gas downward ejector 3A formed of a porous body in which a number of holes are opened in an undersurface, and a base 4A that is located on an upper part of the gas downward ejector 3A, and the base 4A is mounted to a stage mounting base 5A that is located on an upper part of the base 4A. Respective holes of the gas downward ejector 3A correspond to gas downward ejection holes of the present invention.

The stage 2B has a gas upward ejector 3B formed of a porous body in which a number of holes are opened in a top surface and a base 4B that is located on a lower part of the gas upward ejector 3B, and the base 4B is mounted to a stage mounting base 5B that is located on a lower part of the base 4B. Respective holes of the gas upward ejector 3B correspond to gas upward ejection holes of the present invention.

The stage mounting bases 5A and 5B are disposed in a vertical direction, whereby surfaces of the respective ejectors of the stages 2A and 2B are configured to face each other. Thereby, the gas downward ejection holes are overlaid on the gas upward ejection holes in blowout directions.

The stage mounting base 5A is mounted to a height adjusting mechanism 6 that is movable along a Z-axis stage, and capable of adjustment of a height position. By adjustment of the height adjusting mechanism 6, a height position, that is, a blowout position of the gas downward ejector 3A is changed. The height adjusting mechanism 6 corresponds to a position adjusting section of the present invention. By an operation of the height adjusting mechanism 6, a gap L between the stages 2A and 2B can be adjusted.

An air supply pipe 7A communicating with the gas downward ejector 3A is connected to the base 4A, and the air supply pipe 7A is connected to a pressurized gas supplying section not illustrated via a flow control valve 8A. The flow control valve 8A can adjust a flow rate and pressure of gas that is supplied to the gas downward ejector 3A through the air supply pipe 7A. That is, the flow control valve 8A corresponds to a gas flow adjusting section of the present invention.

Further, an air supply pipe 7B communicating with the gas upward ejector 3B is connected to the base 4B, and the air supply pipe 7B is connected to the pressurized gas supplying section not illustrated via a flow control valve 8B. The flow control valve 8B can adjust a flow rate and pressure of gas that is supplied to the gas upward ejector 3B through the air supply pipe 7B. That is, the flow control valve 8B corresponds to a gas flow adjusting section of the present invention.

In the gas downward ejector 3A and the gas upward ejector 3B which receive supply of gas from the air supply pipes 7A and 7B, flow paths are provided to eject pressurized gas from the gas downward ejection holes and the gas upward ejection holes on entire surfaces. The gas downward ejector 3A and the gas upward ejector 3B need to eject pressurized gas uniformly from the entire surfaces, and therefore are desirably formed of porous bodies, but do not always have to be formed of porous bodies, if only the gas downward ejector 3A and the gas upward ejector 3B are ejectors having equivalent performance.

Further, the gas floated workpiece supporting apparatus 1 has a control section 9 that controls the height adjusting mechanism 6, and the flow control valves 8A and 8B. The control section 9 is configured by a CPU, a program that operates the CPU, a storage section such as a nonvolatile memory and a RAM. The control section 9 can adjust the height adjusting mechanism 6 and the flow control valves 8A and 8B by initial setting, and can perform control of dynamically adjusting the height adjusting mechanism 6 and the flow control valves 8A and 8B during noncontact support. Further, control of adjusting the height adjusting mechanism 6, the flow control valves 8A and 8B can be performed based on a detection result for a plate-shaped workpiece 100 that is supported in a noncontact manner, by a height detecting section not illustrated.

The plate-shaped workpiece 100 is installed between the upper and lower stages 2A and 2B. In the present embodiment, the plate-shaped workpiece is described as a glass substrate. A size of the plate-shaped workpiece 100 in Embodiment 1 is a size that is within a range of the top surface of the gas upward ejector 3B of the stages 2A and 2B.

Here, pressurized gas is supplied to the upper and lower stages 2A and 2B through the air supply pipes 7A and 7B. In Embodiment 1, as the pressurized gas, gas such as air, clean dry air, and N2 can be used. As the present invention, the kind of gas is not especially limited.

Pressure and a flow rate of the pressurized gas that is supplied to the upper and lower stages 2A and 2B can be controlled by the flow control valves 8A and 8B respectively. When the pressurized gas is supplied to the upper and lower stages 2A and 2B, the pressure and the flow rate are adjusted by the flow control valves 8A and 8B, and the pressurized gas at arbitrary pressure and flow rate is ejected by the gas downward ejector 3A and the gas upward ejector 3B. The pressurized gas ejected from the gas downward ejector 3A of the upper stage 2A is ejected to a top surface of the plate-shaped workpiece 100. The pressurized gas ejected from the gas upward ejector 3B of the lower stage 2B is ejected to an undersurface of the plate-shaped workpiece 100. An ejecting force of the pressurized gas ejected to the top surface and the undersurface of the plate-shaped workpiece 100 are balanced, and the plate-shaped workpiece 100 is uniformly floated in the entire surface.

Hereunder, a relationship between the ejecting force of the pressurized gas and a floating amount will be described.

Figure 2:
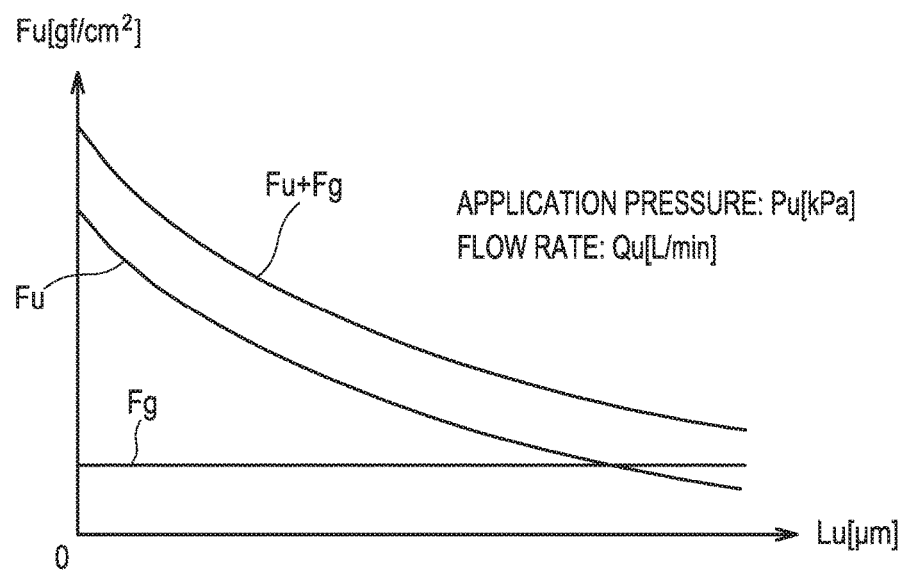
FIG. 2 is a graph showing a relationship between a distance of a gas upward ejector and a plate-shaped workpiece undersurface, and a force per unit volume by gas ejection of the gas upward ejector and a load on the plate-shaped workpiece per unit area, of the embodiment of the present invention.

FIG. 2 shows a relationship between a gap Lu between the stage 2A and the glass substrate as the plate-shaped workpiece 100, and a force Fu [gf/cm2] per unit area that is given to the top surface of the glass substrate by the pressurized gas ejected from the gas downward ejector 3A of the stage 2A, when an arbitrary application pressure Pu [kPa] is applied to the stage 2A in FIG. 1. A gradient and an intercept of a graph and a flow rate Qu [L/min] vary in accordance with a kind of the porous body (a pore diameter and a pore rate). Further, when a load per unit area of the glass substrate is set as Fg, a magnitude of a force that is balanced with the force that is finally ejected to the undersurface of the gas substrate from the stage 2B side is Fu+Fg [gf/cm2]. Hereinafter, the force will be referred to as a gravity direction force Fu+Fg.

Figure 3:
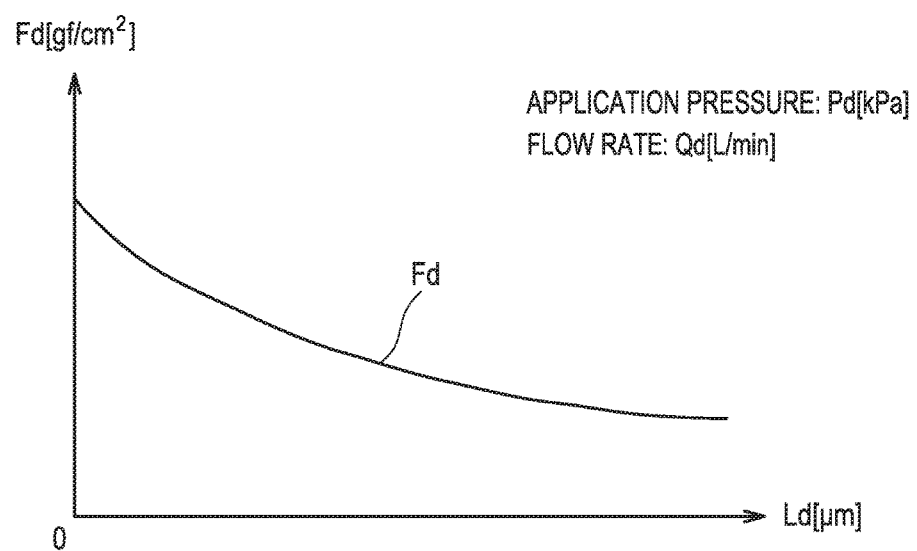
FIG. 3 is a graph showing a relationship between a distance of a gas downward ejector and a plate-shaped workpiece top surface, and a force per unit volume by gas ejection of the gas downward ejector, of the embodiment of the present invention.

FIG. 3 shows a relationship between a gap Ld [μm] between the stage 2B and the glass substrate as the plate-shaped workpiece 100, and a force Fd [gf/cm2] per unit area that is given to the undersurface of the glass substrate by the pressurized gas ejected from the gas upward ejector 3B of the stage 2B, when arbitrary application pressure Pd [kPa] is applied to the stage 2B in FIG. 1. A gradient and an intercept of the graph and a flow rate Qd [L/min] vary in accordance with the kind of the porous body (the pore diameter and the pore rate). Hereinafter, the force Fd will be referred to as the antigravity direction force Fd.

When the gravity direction force Fu+Fg and the force Fd are equal to each other, the forces are balanced, and the glass substrate floats.

When a gap between the stages 1A and 1B is set as L, the gap between the undersurface of the gas downward ejector 3A and the top surface of the glass substrate is set as Lu, and the gap between the top surface of the gas upward ejector 3B and the undersurface of the glass substrate is set as Ld, and the thickness of the glass substrate is set as Lg, L is expressed by $$|L|=|Lu|+|Lg|+|Ld|.$$

Here, the gravity direction force Fu+Fg is applied to the top surface of the glass substrate, and the antigravity direction force Fd is applied to the undersurface of the glass substrate.

$$|Lu|\leq|L|-|Lg|=|Lu|+|Ld|$$

$$|Ld|\leq|L|-|Lg|=|Lu|+|Ld|$$

Figure 4:
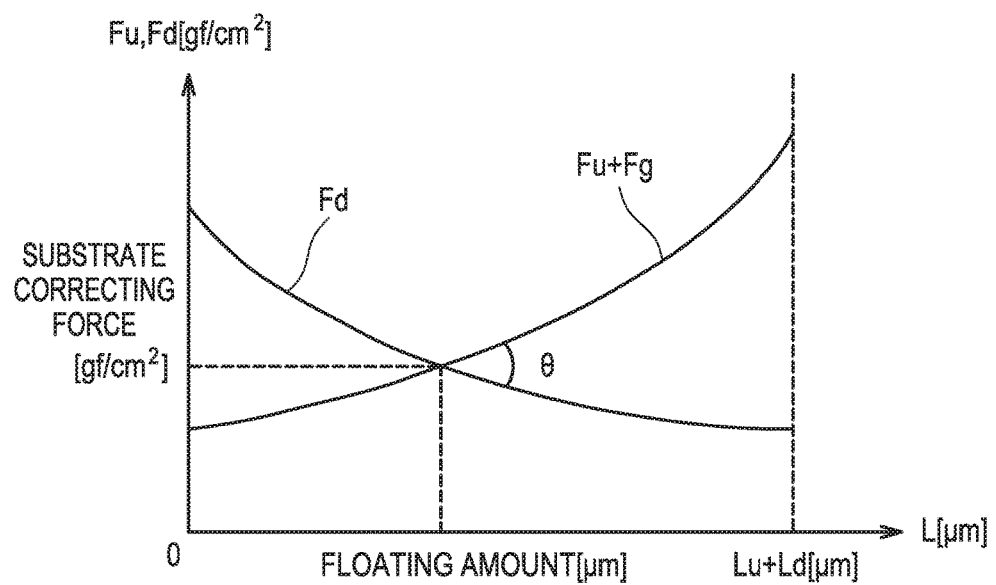
FIG. 4 is a graph showing a relationship between a distance of the gas upward ejector and the plate-shaped workpiece undersurface, and the force per unit area by gas ejection of the gas upward ejector and the force per unit area by gas ejection of the gas downward ejector.

Consequently, the forces in the opposite directions are regarded as being applied to the same range, so that when the antigravity direction is set as a normal direction, in FIG. 4 where FIG. 2 is reversed and FIG. 3 is overlaid on reversed FIG. 2, a value on an X axis of an intersection point of the graph of the gravity direction force (Fu+Fg) and the graph of the antigravity direction force Fd corresponds to the floating amount, and the floating amount is the same with respect to the entire surface of the glass substrate, that is, the floating amount is fixed.

Further, when the value on the Y-axis at the intersection point is seen, the value represents the force given to the unit areas of the upper and lower surfaces of the glass substrate, and the plate-shaped workpiece is in the state pressed by the force from up and down. That is, the glass substrate is in the state where the entire upper and lower surfaces are pressed with air, and this becomes a substrate correcting force that corrects the glass substrate to be flat.

Further, when the floating amount changes by a temporary disturbance, for example, when the floating amount becomes small, Fu+Fg becomes small, and Fd becomes large. Consequently, the antigravity direction force>gravity direction force is established, so that the force pushes up the glass substrate, and returns to a balance point. When the floating amount becomes large, Fu+Fg becomes large, and Fd becomes small. Consequently, the gravity direction force>antigravity direction force, and the force presses down the glass substrate and returns to the balance point.

The force to return to the balance point, namely, floating rigidity varies depending on an intersection angle θ in the graph of the force in the gravity direction and the force in the antigravity direction in the balance point. As the intersection angle θ is larger, the floating rigidity is higher, whereas as the intersection angle θ is smaller, the floating rigidity is lower.

In the present embodiment, by changing a gap of the pressures that are applied to the stages configured to float a workpiece, and the kind of the flotation devices, the distances between the stages and the plate-shaped workpiece, and the flow rate and the pressure of gas ejection are changed, and the floating amount, the substrate correcting force and the floating rigidity described above can be arbitrarily set.

In the above-described embodiment, the air supply pipes 7A and 7B are respectively connected to the gas downward ejector 3A and the gas upward ejector 3B respectively, and in each of the gas downward ejector 3A and the gas upward ejector 3B, the gas flow rate and the pressure are made adjustable. However, each of the gas downward ejector 3A and the gas upward ejector 3B is divided into a plurality of areas, and the gas flow rate and the pressure can be made adjustable in each of the areas, or the gas flow rate and the pressure can be made adjustable for each of the individual ejection holes. Further, a configuration can be adopted in which adjustment of only either one of the gas flow rate and pressure is performed.

Second Embodiment

Figure 5:
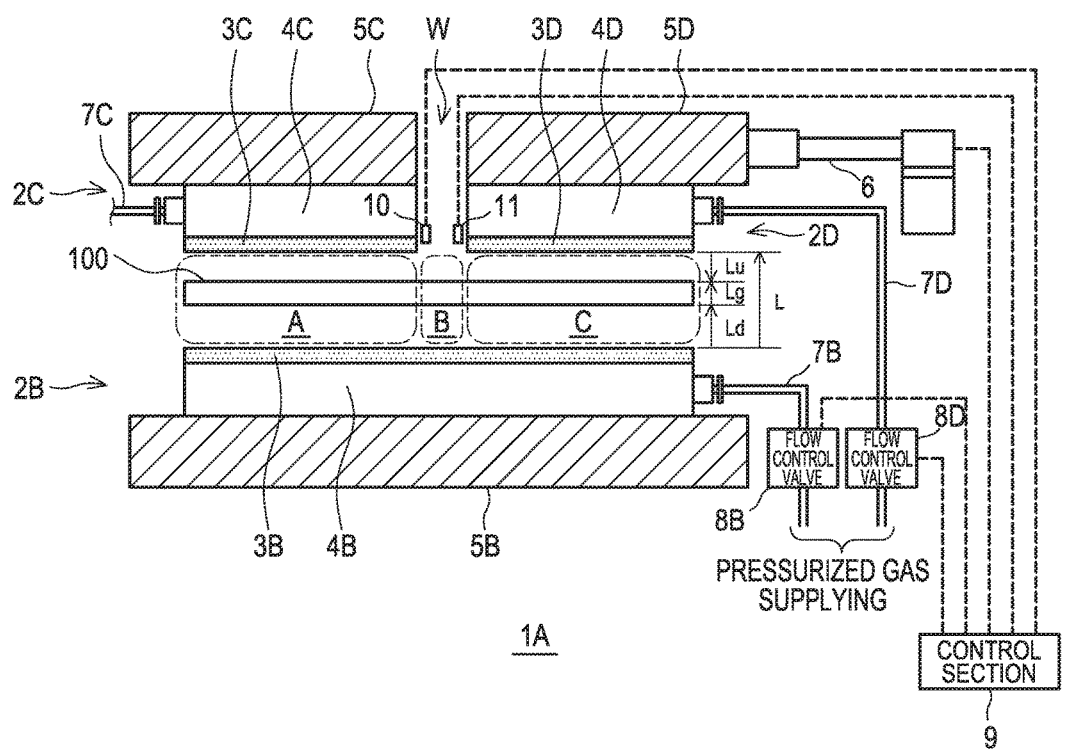
FIG. 5 is a diagram illustrating a gas floated workpiece supporting apparatus of Embodiment 2 of the present invention.

In Embodiment 1 described above, the gas downward ejector is installed in accordance with the entire gas upward ejector, but the gas downward ejector can be installed in accordance with a part of the gas upward ejector. Embodiment 2 will be described based on FIG. 5. In the drawing, the gas upward ejector can be installed in accordance with a part of the gas downward ejector.

In Embodiment 2, a working area W for the plate-shaped workpiece 100 is provided, and the gas downward ejector is provided to avoid the working area W.

In Embodiment 2, the stage 2B side has similar components to the components in Embodiment 1, so that the similar components are assigned with the same reference signs, and detailed explanation of the similar components is omitted.

Meanwhile, at an upper part, a stage 2C configured to float a workpiece and a stage 2D configured to float a workpiece are provided to face the stage 2B to avoid the working area W.

The stage 2C is located at one side of the working area W, and has a gas downward ejector 3C that is formed of a porous body with a number of holes opened on an undersurface, and a base 4C located at an upper part of the gas downward ejector 3C, and the base 4C is mounted on a stage mounting base 5C located on an upper part of the base 4C. Respective holes of the gas downward ejector 3C correspond to the gas downward ejection holes of the present invention.

The stage 2D is located at the other side of the working area W, and has a gas downward ejector 3D that is formed of a porous body with a number of holes opened on an undersurface, and a base 4D located at an upper part of the gas downward ejector 3D, and the base 4D is mounted on a stage mounting base 5D located on an upper part of the base 4D. Respective holes of the gas downward ejector 3D correspond to the gas downward ejection holes of the present invention.

Though not illustrated, the stage mounting base 5C and the stage mounting base 5D are connected, and are mounted to the height adjusting mechanism 6 movable along the Z-axis stage, so that adjustment of height positions is enabled. By adjustment of the height adjusting mechanism 6, the height positions, that is, blowout positions of the gas downward ejector 3C and the gas downward ejector 3D are changed. By the operation, the gap L between the stage 2B, and the stages 2C and 2D can be adjusted.

Here, it is described that the stage mounting base 5C and the stage mounting base 5D are connected and mounted to the height adjusting mechanism 6, but a configuration can be adopted in which the stage mounting base 5C and the stage mounting base 5D are respectively mounted to independent height adjusting mechanisms, and heights of the stage mounting base 5C and the stage mounting base 5D can be adjusted independently from each other.

An air supply pipe 7D communicating with the gas downward ejector 3D is connected to the base 4D, the air supply pipe 7D is connected to a pressurized gas supplying section not illustrated through a flow control valve 8D. The flow control valve 8D can adjust a flow rate and pressure of the gas that is supplied to the gas downward ejector 3D through the air supply pipe 7D. That is, the flow control valve 8D corresponds to the gas flow adjusting section of the present invention.

Further, an air supply pipe 7C communicating with the gas downward ejector 3C is connected to the base 4C. The air supply pipe 7C can adjust a flow rate and pressure of gas by the flow control valve 8D by being connected to the air supply pipe 7D.

The air supply pipe 7C is not connected to the air supply pipe 7D, and a flow control valve (not illustrated) that is separate from the flow control valve 8D is interposed in the air supply pipe 7C, so that the gas flow rate and the pressure at the air supply pipe 7C side can be adjusted independently from the air supply pipe 7D side.

Further, a gas floated workpiece supporting apparatus 1A has the control section 9 that controls the height adjusting mechanism 6, and the flow control valve 8D. The control section 9 is configured by a CPU and a program that operates the CPU, and a storage section such as a nonvolatile memory and a RAM. The control section 9 can adjust the height adjusting mechanism 6 and the flow control valve 8D by initial setting, or can perform control of adjusting the height adjusting mechanism 6 and the flow control valve 8D during noncontact support.

Further, in Embodiment 2, height detecting sections 10 and 11 that detect a height of the plate-shaped workpiece is installed in the working area W so as to be located at both the sides of the working area W. The height detecting sections 10 and 11 detect a height position of the plate-shaped workpiece 100 by using a light sensor, laser or the like. Detection results of the height detecting sections 10 and 11 are transmitted to the control section 9, and control of adjusting the height adjusting mechanism 6 and the flow control valve D can be performed based on the detection results to the plate-shaped workpiece 100 by the height detecting sections 10 and 11.

In Embodiment 2, work such as laser irradiation and exposure to the glass substrate, for example, can be performed through the working area W. At this time, in an area B, only the force in the antigravity direction from the stage 2B is applied, and a correcting force to the plate-shaped workpiece 100 is not obtained. However, the plate-shaped workpiece 100 is corrected to be flat and floats in an area A and an area C, the plate-shaped workpiece 100 further has rigidity so that the plate-shaped workpiece 100 does not rise greatly only in the area B portion, and a floating amount that is uniform enough not to exert an adverse effect on working can also be ensured in the area B.

Embodiment 3

In Embodiment 2 described above, the gas downward ejector is installed in accordance with the gas upward ejector except for the working area, but the gas downward ejector can be installed in only a vicinity of the working area. Embodiment 3 will be described based on FIGS. 6(A) and (B).

In Embodiment 3, flotation devices 20B, 20C and 20D configured to float a workpiece are disposed at a lower side along a conveying direction of the plate-shaped workpiece 100. The plate-shaped workpiece 100 is conveyed in an illustrated conveying direction in a noncontact state by a conveying device 15.

The stage 20B has a gas upward ejector 23B formed of a porous body with a number of holes opened on a top surface and a base 24B located on a lower part of the gas upward ejector 23B. The stage 20C has a gas upward ejector 23C formed of a porous body with a number of holes opened on a top surface and a base 24C located on a lower part of the gas upward ejector 23C. The stage 20D has a gas upward ejector 23D formed of a porous body with a number of holes opened on a top surface and a base 24D located on a lower part of the gas upward ejector 23D. The bases 24B, 24C and 24D are commonly mounted to the stage mounting base 5B located on lower parts of the bases 24B, 24C and 24D. The respective holes of the gas upward ejectors 23B, 23C and 23D correspond to the gas upward ejection holes of the present invention.

Meanwhile, on an upper side, in positions sandwiching the working area W, a stage 2E and a stage 2F configured to float a workpiece are installed in accordance with a region of the stage 20C.

The stage 2E is located at one side of the working area W, and has a gas downward ejector 3E formed of a porous body opened on an undersurface and a base 4E located on an upper part of the gas downward ejector 3E. The base 4E is mounted to a stage mounting base 5E located on an upper part of the base 4E. Respective holes of the gas downward ejector 3E correspond to the gas downward ejection holes of the present invention.

The stage 2F is located at the other side of the working area W, and has a gas downward ejector 3F formed of a porous body opened on an undersurface and a base 4F located on an upper part of the gas downward ejector 3F. The base 4F is mounted to a stage mounting base 5F located on an upper part of the base 4F. Respective holes of the gas downward ejector 3F correspond to the gas downward ejection holes of the present invention.

Though not illustrated in the drawings, the stage mounting base 5E and the stage mounting base 5F are connected and are mounted to the height adjusting mechanism 6 movable along the Z-axis stage, and adjustment of a height position is enabled. Height positions, that is, the blowout positions of the gas downward ejector 3E and the gas downward ejector 3F are changed by adjustment of the height adjusting mechanism 6. By the operation, the gap L between the stage 20C, and the stages 2E and 2F can be adjusted.

Here, it is described that the stage mounting base 5E and the stage mounting base 5F are connected and are mounted to the height adjusting mechanism 6, but a configuration can be adopted, in which the stage mounting base 5E and the stage mounting base 5F are respectively mounted to independent height adjusting mechanisms and heights thereof can be adjusted individually.

Air supply pipes not illustrated that communicate with the gas downward ejectors 3E and 3F are connected to the bases 4E and 4F. In the air supply pipes, a flow control valve as a flow adjusting section can be provided as in the aforementioned embodiments, and gas flow rates and pressures can be made adjustable individually by providing an air supply pipe and a flow adjusting section for each of the bases 4E and 4F.

Further, in a gas floated workpiece supporting apparatus 1B, a control section that controls the height adjusting mechanism 6 and the flow control valve can be provided to control operations. At that time, a height detecting section that detects a height of the plate-shaped workpiece is installed in the working area W, a detection result of the height detecting section is transmitted to the control section and the above-described control can be performed.

In Embodiment 3, the plate-shaped workpiece 100 is corrected to be flat only in a region in the vicinity of a working point, and floating with high precision can be realized.

Embodiment 3 has the conveying device 15 that conveys the plate-shaped workpiece 100 along the illustrated conveying direction as described above. The conveying device 15 grasps a part of the plate-shaped workpiece 100 to give a moving force along the conveying direction, and performs conveyance by pushing from a rear side in the conveying direction, pulling from a front side in the conveying direction and the like. Further, the mechanism that conveys the plate-shaped workpiece 100 by pressure of gas can be adopted. As the present invention, a configuration of the conveying device is not specially limited, and the configuration that can convey an object to be conveyed that is floated by gas can be adopted.

Figure 6:
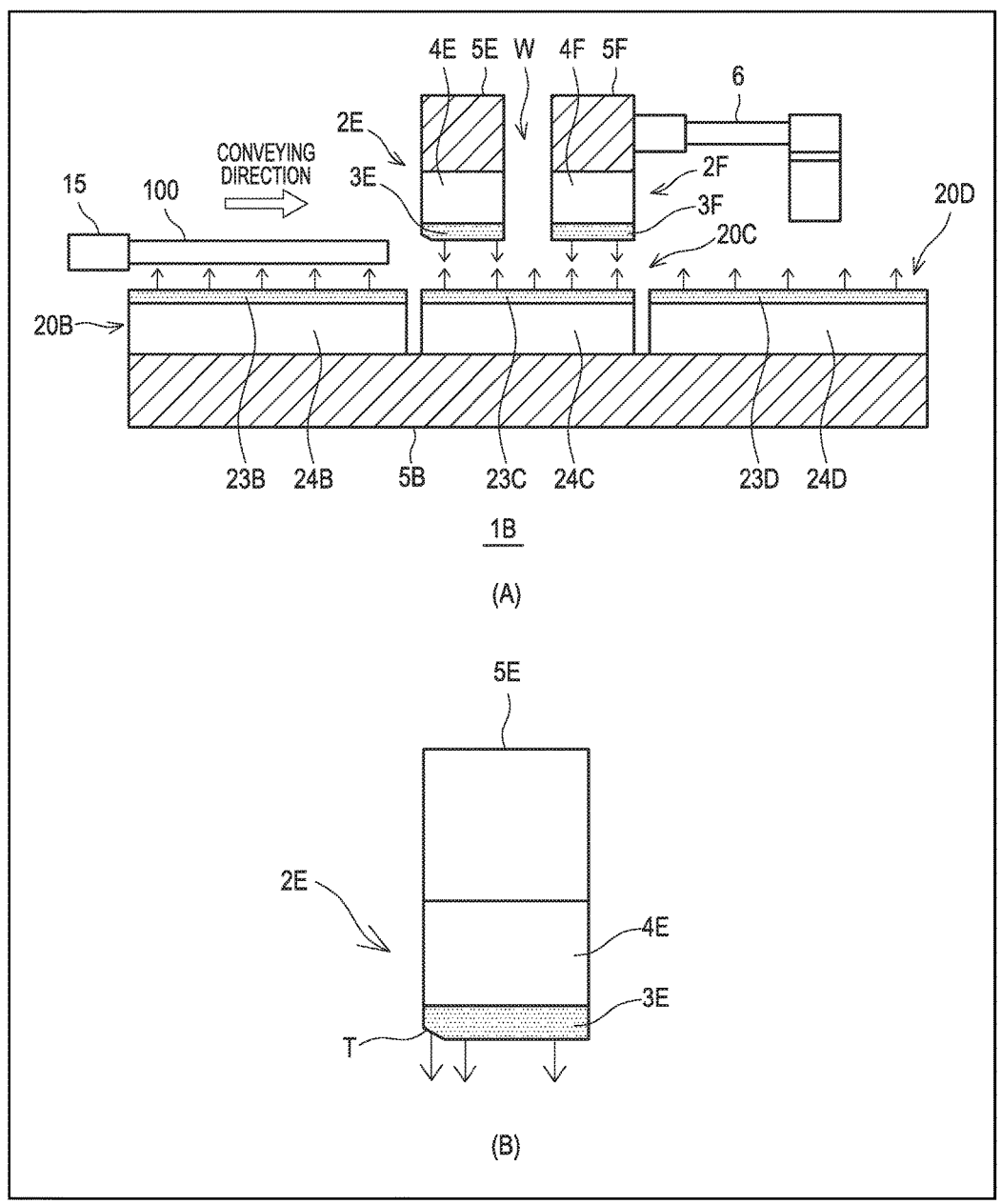
FIG. 6 is a diagram illustrating in (A) a gas floated workpiece supporting apparatus, and in (B) a partial enlarged diagram of a stage 2E of Embodiment 3 of the present invention.
Figure 7:
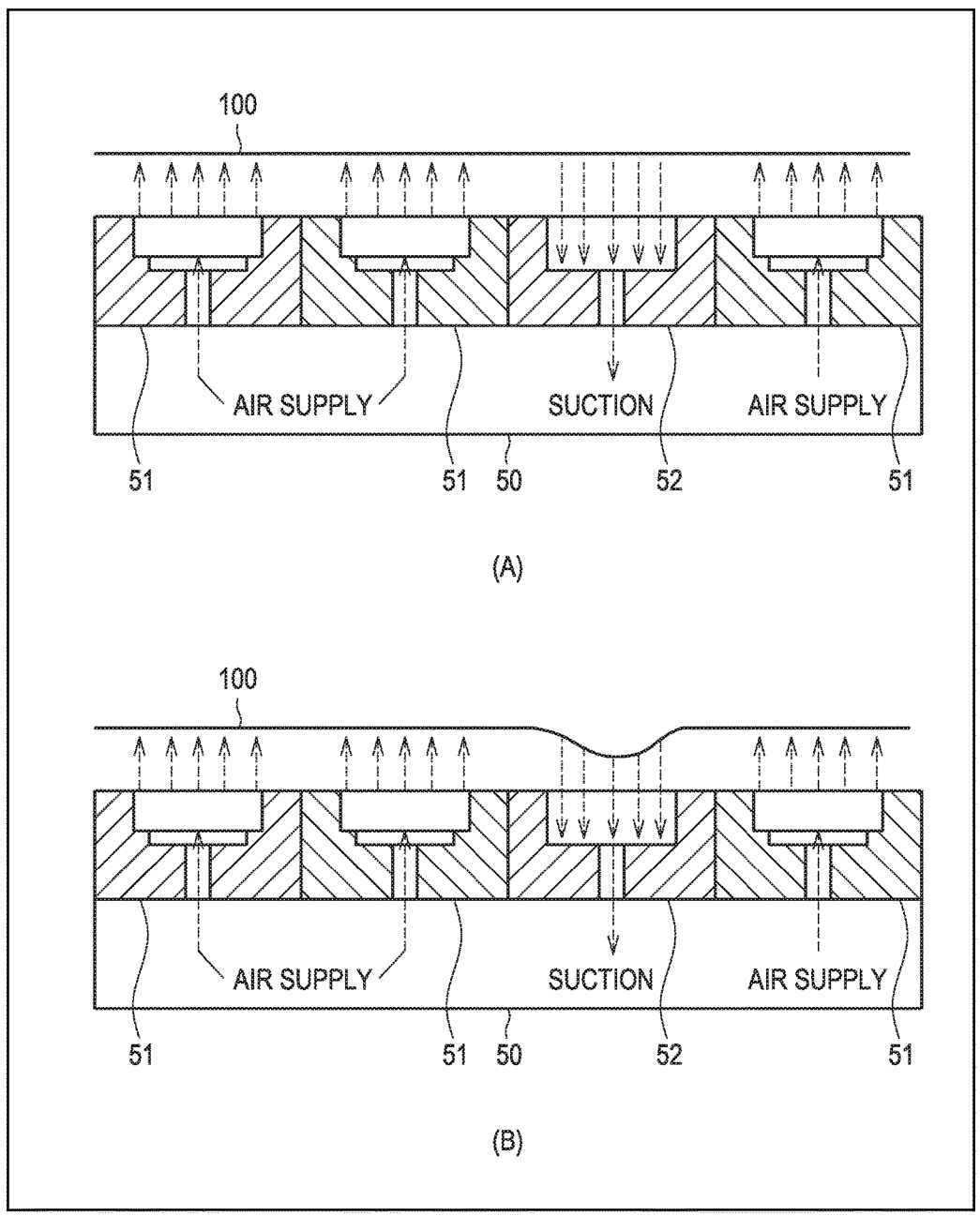
FIG. 7 is illustrating in (A) a floatation apparatus in Patent Literature 1, and in (B) illustrating a problem of the floatation apparatus.
Figure 8:
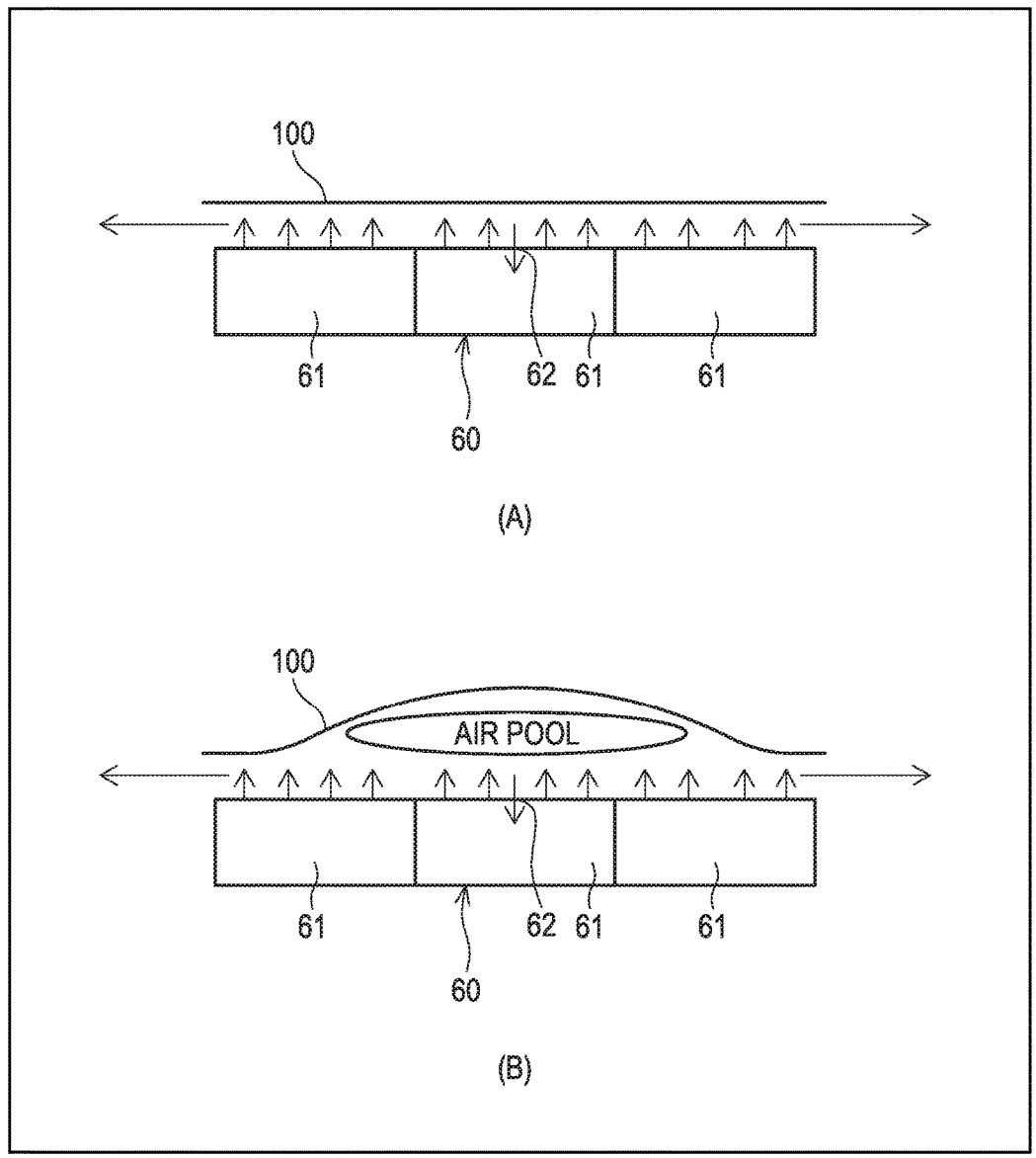
FIG. 8 is illustrating in (A) a floatation apparatus in Patent Literature 2, and illustrating in (B) a problem of the floatation apparatus.

The plate-shaped workpiece 100 is conveyed in a noncontact manner along the conveying direction illustrated in FIG. 6 over the stage 20B configured to float a workpiece.

At this time, at an upstream side in the conveying direction, the plate-shaped workpiece 100 only floats by pressurized gas ejected from the stage 20B, so that the plate-shaped workpiece 100 is not corrected to be flat, and precision of the floating amount of the plate-shaped workpiece 100 is low.

Thereafter, the plate-shaped workpiece 100 is conveyed over the stage 20B to a downstream side, and enters between the stages 2E and 20C. In order to make it easier for the plate form work 100 to enter between the stages 2E and 20C at this time, work such as a tapered portion T can be performed at an upstream side in the conveying direction of the gas downward ejector 3E of the stage 2E so that a distance from the plate-shaped workpiece 100 becomes larger toward an upstream end. Thereby, when the plate-shaped workpiece 100 enters between the stages 2E and 20C, variation of the pressure from above can be decreased to decrease swing or the like of the plate form work 100. Further, a similar operation can be obtained by making the flow rate and pressure of the gas lower at the upstream side in the conveying direction of the gas downward ejector 3E than at the downstream side in the conveying direction of the gas downward ejector 3E.

The plate-shaped workpiece 100 obtains a floating amount with high precision in the region between the stages 2E and 20C according to the floating principle shown in Embodiment 1. When conveyance progresses, the plate-shaped workpiece 100 is floated and supported by only the stage 20D, from the region between the stages 2E and 20C. Correction is not performed in the region, and support with low precision is performed.

According to Embodiment 3, the plate-shaped workpiece can be floated with high precision in the vicinity of the working point (region for working purpose), and in the region except for the region for working purpose (region for the purpose of only conveyance), the plate-shaped workpiece can be floated to such an extent that the plate-shaped workpiece can be conveyed without contacting the stages by the pressurized gas ejected from the stages 20B and 20D, so that the apparatus structure is simplified and apparatus cost can be reduced. In Embodiment 3, the plate-shaped workpiece can be conveyed by being supported in a noncontact manner, irrespective of the size of the plate form work.

The present invention has been described thus far based on the above-described respective embodiments, and arbitrary changes can be made without departing from the scope of the present invention.

REFERENCE SIGNS LIST

1 Gas floated workpiece supporting apparatus
1A Gas floated workpiece supporting apparatus
1B Gas floated workpiece supporting apparatus
2A stage
2B stage
2C stage
2D stage
2E stage
2F stage
3A Gas downward ejector
3B Gas downward ejector
3C Gas downward ejector
3D Gas downward ejector
3E Gas downward ejector
3F Gas downward ejector
6 Height adjusting mechanism
7A Air supply pipe
8A Flow control valve
7B Air supply pipe
8B Flow control valve
8D Flow control valve
9 Control section
10 Height detecting section
11 Height detecting section
15 Conveying device
20B stage
20C stage
20D stage
23B Gas upward ejector
23C Gas upward ejector
23D Gas upward ejector
W Working area
T Tapered portion

The invention claimed is:

1. An apparatus for conveying a substrate, the apparatus comprising:
a base along which the substrate is conveyed;
a first upward gas ejecting section, a second upward gas ejecting section and a third upward gas ejecting section disposed over the base, the third upward gas ejecting section being disposed between the first and second upward gas ejecting sections; and
a first downward gas ejecting section and a second downward gas ejecting section disposed above and facing respective portions of the third upward gas ejecting section,
wherein:
gas ejected upward from the first, second and third upward gas ejecting sections floats the substrate,
the substrate is subjected to pressure by gas ejected downward from the first and second downward gas ejecting sections,
the first and second downward gas ejecting sections are spaced to provide a working area therebetween and through which the substrate is irradiated with a laser beam, and
the third upward gas ejecting section is arranged in an area directly below the working area so as to overlap with the working area in a plan view.

2. The apparatus according to claim 1, wherein floating height of the substrate above the third upward gas ejecting section is controlled with higher precision than floating height of the substrate above the first and second upward ejecting sections.

3. The apparatus according to claim 1, wherein pressures of upward and downward ejected gases are balanced to stabilize the substrate in a vertical direction above the third upward gas ejecting section.

4. The apparatus according to claim 1, wherein the third upward gas ejecting section has a porous main surface through which gas is ejected upward.

5. The apparatus according to claim 1, wherein:
the substrate is conveyed in a direction from the first downward gas ejecting section to the second downward gas ejecting section,
a main surface of the first downward gas ejecting section has two end portions,
one of the two end portions is farther from the second downward gas ejecting section than another of the two end portions, and
the one of the two end portions is tapered.

6. The apparatus according to claim 1, further comprising a height adjusting mechanism configured to move the first and second downward gas ejecting sections in a vertical direction.

7. The apparatus according to claim 1, further comprising flow control valves disposed to control flow rates and pressures of the upward and the downward ejected gases.

8. The apparatus according to claim 1, further comprising a height detector configured to detect a floating height of the substrate, wherein a flow rate and a pressure of each of the upward gas and the downward gas are controlled based on the floating height detected by the height detector.

9. The apparatus according to claim 1, wherein the upward gas is air or nitrogen.

10. The apparatus according to claim 1, wherein the downward gas is air or nitrogen.

11. The apparatus according to claim 1, wherein the substrate is comprised of glass.

12. An apparatus for conveying a substrate, the apparatus comprising:
a base along which the substrate is conveyed;
a first upward gas ejecting section, a second upward gas ejecting section and a third upward gas ejecting section disposed over the base, the third upward gas ejecting section being disposed between the first and second upward gas ejecting sections; and a first downward gas ejecting section and a second downward gas ejecting section disposed above and facing respective portions of the third upward gas ejecting section, wherein:

gas ejected upward from the first, second and third upward gas ejecting sections floats the substrate, the substrate is subjected to pressure by gas ejected downward from the first and second downward gas ejecting sections, the first and second downward gas ejecting sections are spaced to provide a working area therebetween and through which the substrate is irradiated with a laser beam, and wherein floating height of the substrate above the third upward gas ejecting section is controlled with higher precision than floating height of the substrate above the first and second upward ejecting sections.

13. An apparatus for conveying a substrate, the apparatus comprising:

a base along which the substrate is conveyed;

a first upward gas ejecting section, a second upward gas ejecting section and a third upward gas ejecting section disposed over the base, the third upward gas ejecting section being disposed between the first and second upward gas ejecting sections;

a first downward gas ejecting section and a second downward gas ejecting section disposed above and facing respective portions of the third upward gas ejecting section; and a height adjusting mechanism configured to move the first and second downward gas ejecting sections in a vertical direction, wherein:

gas ejected upward from the first, second and third upward gas ejecting sections floats the substrate, the substrate is subjected to pressure by gas ejected downward from the first and second downward gas ejecting sections, and the first and second downward gas ejecting sections are spaced to provide a working area therebetween and through which the substrate is irradiated with a laser beam.

* * * * *